(12) United States Patent
Megretski et al.

(10) Patent No.: US 10,581,470 B2
(45) Date of Patent: Mar. 3, 2020

(54) LINEARIZATION SYSTEM

(71) Applicant: NanoSemi, Inc., Waltham, MA (US)

(72) Inventors: Alexandre Megretski, Concord, MA (US); Zohaib Mahmood, Ashland, MA (US); Kevin Chuang, Cambridge, MA (US); Yan Li, Lexington, MA (US); Helen H. Kim, Sudbury, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/004,594

(22) Filed: Jun. 11, 2018

(65) Prior Publication Data
US 2019/0260401 A1 Aug. 22, 2019

Related U.S. Application Data

(60) Provisional application No. 62/517,380, filed on Jun. 9, 2017.

(51) Int. Cl.
*H04B 1/04* (2006.01)
*H03F 1/32* (2006.01)

(52) U.S. Cl.
CPC ......... *H04B 1/0475* (2013.01); *H03F 1/3258* (2013.01); *H04B 2001/0425* (2013.01)

(58) Field of Classification Search
CPC .......... H04B 1/0475; H04B 2001/0425; H03F 1/3258
See application file for complete search history.

(56) References Cited

U.S. PATENT DOCUMENTS

| | | |
|---|---|---|
| 4,979,126 A | 12/1990 | Pao et al. |
| 5,819,165 A | 10/1998 | Hulkko et al. |
| 5,980,457 A | 11/1999 | Averkiou |
| 6,052,412 A | 4/2000 | Ruether et al. |
| 6,240,278 B1 | 5/2001 | Midya et al. |
| 7,295,815 B1 | 11/2007 | Wright et al. |
| 7,529,652 B1 | 5/2009 | Gahinet et al. |
| 7,599,431 B1 | 10/2009 | Anderson et al. |
| 7,904,033 B1 | 3/2011 | Wright et al. |
| 8,446,979 B1 | 5/2013 | Yee |
| 9,130,628 B1 | 9/2015 | Mittal et al. |
| 9,226,189 B1 | 12/2015 | Kularatna et al. |

(Continued)

FOREIGN PATENT DOCUMENTS

| | | |
|---|---|---|
| WO | WO2012154430 A1 | 11/2012 |
| WO | WO2018156932 A1 | 8/2018 |

(Continued)

OTHER PUBLICATIONS

Aguirre, et al., "On the Interpretation and Practice of Dynamical Differences Between Hammerstein and Wiener Models", IEEE Proceedings on Control Theory Appl; vol. 152, No. 4, Jul. 2005, pp. 349-356.

(Continued)

*Primary Examiner* — Vineeta S Panwalkar
(74) *Attorney, Agent, or Firm* — Occhiuti & Rohlicek LLP (57) ABSTRACT

A linearization system computes a robust set of quantities characterizing a nonlinearity of a transmit chain including a power amplifier by combining a current set of quantities characterizing the nonlinearity of the transmit chain with a weighted combination of prior sets of quantities characterizing the nonlinearity of the transmit chain.

20 Claims, 3 Drawing Sheets

(56) References Cited

U.S. PATENT DOCUMENTS

| | | | |
|---|---|---|---|
| 9,337,782 B1 | 5/2016 | Mauer et al. | |
| 9,590,668 B1 | 3/2017 | Kim et al. | |
| 9,749,161 B1* | 8/2017 | Gal | H04L 25/03885 |
| 9,973,370 B1 | 5/2018 | Langer et al. | |
| 10,080,178 B2 | 9/2018 | Stapleton et al. | |
| 10,141,896 B2 | 11/2018 | Huang | |
| 2002/0080891 A1 | 6/2002 | Ahn et al. | |
| 2003/0184374 A1 | 10/2003 | Huang et al. | |
| 2003/0207680 A1 | 11/2003 | Yang et al. | |
| 2004/0076247 A1 | 4/2004 | Barak et al. | |
| 2004/0116083 A1 | 6/2004 | Suzuki et al. | |
| 2004/0142667 A1 | 7/2004 | Lochhead et al. | |
| 2004/0196922 A1 | 10/2004 | Leffel | |
| 2005/0001684 A1 | 1/2005 | Braithwaite | |
| 2005/0163251 A1 | 7/2005 | McCallister | |
| 2005/0163252 A1 | 7/2005 | McCallister et al. | |
| 2005/0180527 A1 | 8/2005 | Suzuki et al. | |
| 2005/0190857 A1 | 9/2005 | Braithwaite | |
| 2006/0022751 A1 | 2/2006 | Fuller et al. | |
| 2006/0154622 A1 | 7/2006 | Piirainen | |
| 2006/0229036 A1 | 10/2006 | Muller et al. | |
| 2006/0276147 A1 | 12/2006 | Suzuki et al. | |
| 2007/0091992 A1 | 4/2007 | Dowling | |
| 2007/0230557 A1 | 10/2007 | Balasubramonian et al. | |
| 2007/0241812 A1 | 10/2007 | Yang et al. | |
| 2007/0247487 A1 | 10/2007 | Nakamura et al. | |
| 2008/0019453 A1 | 1/2008 | Zhao et al. | |
| 2008/0039045 A1 | 2/2008 | Filipovic et al. | |
| 2008/0057882 A1 | 3/2008 | Singerl et al. | |
| 2008/0101502 A1 | 5/2008 | Navidpour et al. | |
| 2008/0268795 A1 | 10/2008 | Saed | |
| 2008/0285640 A1 | 11/2008 | McCallister et al. | |
| 2009/0201084 A1 | 8/2009 | See et al. | |
| 2010/0026354 A1 | 2/2010 | Utsunomiya et al. | |
| 2010/0048149 A1 | 2/2010 | Tang et al. | |
| 2010/0225390 A1 | 9/2010 | Brown et al. | |
| 2011/0044158 A1 | 2/2011 | Tao et al. | |
| 2011/0085490 A1 | 4/2011 | Schlee | |
| 2011/0098011 A1 | 4/2011 | Camp, Jr. et al. | |
| 2011/0128992 A1 | 6/2011 | Maeda et al. | |
| 2011/0135035 A1 | 6/2011 | Bose et al. | |
| 2011/0150130 A1 | 6/2011 | Kenington | |
| 2011/0163806 A1 | 7/2011 | Hongo | |
| 2011/0187437 A1 | 8/2011 | Perreault et al. | |
| 2011/0255627 A1 | 10/2011 | Gotman et al. | |
| 2011/0273234 A1 | 11/2011 | Heijden et al. | |
| 2011/0273236 A1 | 11/2011 | Heijden et al. | |
| 2012/0093210 A1 | 4/2012 | Schmidt et al. | |
| 2012/0108189 A1 | 5/2012 | McCallister et al. | |
| 2012/0119810 A1 | 5/2012 | Bai | |
| 2012/0119811 A1 | 5/2012 | Bai et al. | |
| 2012/0119831 A1 | 5/2012 | Bai | |
| 2012/0154033 A1 | 6/2012 | Lozhkin | |
| 2012/0154430 A1 | 6/2012 | Matsushima et al. | |
| 2012/0176195 A1 | 7/2012 | Dawson et al. | |
| 2012/0200355 A1 | 8/2012 | Braithwaite | |
| 2012/0219048 A1 | 8/2012 | Camuffo et al. | |
| 2012/0286865 A1 | 11/2012 | Chandrasekaran | |
| 2012/0286985 A1 | 11/2012 | Chandrasekaran et al. | |
| 2012/0293252 A1 | 11/2012 | Sorrells et al. | |
| 2012/0295558 A1 | 11/2012 | Wang et al. | |
| 2013/0033317 A1 | 2/2013 | Hawkes | |
| 2013/0034188 A1 | 2/2013 | Rashev et al. | |
| 2013/0044791 A1 | 2/2013 | Rimini et al. | |
| 2013/0094610 A1 | 4/2013 | Ghannouchi et al. | |
| 2013/0094612 A1 | 4/2013 | Kim et al. | |
| 2013/0163512 A1 | 6/2013 | Rexberg et al. | |
| 2013/0251065 A1 | 9/2013 | Bai | |
| 2013/0259159 A1 | 10/2013 | McCallister et al. | |
| 2013/0329833 A1 | 12/2013 | Bai | |
| 2014/0161159 A1 | 6/2014 | Black et al. | |
| 2014/0161207 A1 | 6/2014 | Teterwak | |
| 2014/0177695 A1 | 6/2014 | Cha et al. | |
| 2014/0187182 A1 | 7/2014 | Yan et al. | |
| 2014/0254716 A1 | 9/2014 | Zhou et al. | |
| 2014/0274105 A1 | 9/2014 | Wang | |
| 2014/0347126 A1 | 11/2014 | Laporte et al. | |
| 2015/0043323 A1 | 2/2015 | Choi et al. | |
| 2015/0043678 A1 | 2/2015 | Hammi | |
| 2015/0049841 A1 | 2/2015 | Laporte et al. | |
| 2015/0061761 A1 | 3/2015 | Wills et al. | |
| 2015/0103952 A1 | 4/2015 | Wang et al. | |
| 2015/0123735 A1 | 5/2015 | Wimpenny | |
| 2015/0171768 A1 | 6/2015 | Perreault | |
| 2015/0325913 A1 | 11/2015 | Vagman | |
| 2015/0326349 A1 | 11/2015 | Yang et al. | |
| 2015/0333781 A1 | 11/2015 | Alon et al. | |
| 2015/0358039 A1 | 12/2015 | Xiong et al. | |
| 2015/0381216 A1 | 12/2015 | Shor et al. | |
| 2015/0381220 A1 | 12/2015 | Gal et al. | |
| 2016/0028433 A1 | 1/2016 | Ding et al. | |
| 2016/0087604 A1 | 3/2016 | Kim et al. | |
| 2016/0094253 A1 | 3/2016 | Weber et al. | |
| 2016/0095110 A1 | 3/2016 | Li et al. | |
| 2016/0100180 A1 | 4/2016 | Oh | |
| 2016/0112222 A1 | 4/2016 | Pashay-Kojouri et al. | |
| 2016/0191020 A1 | 6/2016 | Velazquez | |
| 2016/0241277 A1 | 8/2016 | Rexberg et al. | |
| 2016/0249300 A1 | 8/2016 | Tsai et al. | |
| 2016/0285485 A1* | 9/2016 | Fehri | H04B 1/0475 |
| 2016/0308577 A1 | 10/2016 | Molina et al. | |
| 2016/0373072 A1 | 12/2016 | Magesacher et al. | |
| 2017/0005627 A1 | 1/2017 | Zhao et al. | |
| 2017/0033969 A1 | 2/2017 | Yang et al. | |
| 2017/0041124 A1 | 2/2017 | Khandani | |
| 2017/0047899 A1 | 2/2017 | Abdelrahman et al. | |
| 2017/0077981 A1 | 3/2017 | Tobisu et al. | |
| 2017/0176507 A1 | 6/2017 | O'Keeffe et al. | |
| 2017/0237455 A1 | 8/2017 | Ye et al. | |
| 2017/0302233 A1 | 10/2017 | Huang | |
| 2017/0338841 A1 | 11/2017 | Pratt | |
| 2018/0097530 A1 | 4/2018 | Yang et al. | |
| 2018/0167092 A1 | 6/2018 | Hausmair et al. | |
| 2018/0287569 A1 | 10/2018 | Xu et al. | |
| 2018/0337700 A1 | 11/2018 | Huang et al. | |
| 2019/0238204 A1 | 8/2019 | Kim et al. | |
| 2019/0260401 A1 | 8/2019 | Megretski et al. | |
| 2019/0260402 A1 | 8/2019 | Chuang | |

FOREIGN PATENT DOCUMENTS

| | | |
|---|---|---|
| WO | WO2018213558 A1 | 11/2018 |
| WO | WO2018227093 A1 | 12/2018 |
| WO | WO2018227111 A1 | 12/2018 |
| WO | WO2019014422 A1 | 1/2019 |
| WO | WO2019070573 A1 | 4/2019 |
| WO | WO2019094713 A1 | 5/2019 |
| WO | WO2019094720 A1 | 5/2019 |

OTHER PUBLICATIONS

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch, et al. "Measurement and Simulation of Memory Effects in Predistortion Linearizers," IEEE Transactions on Mircrowave Theory and Techniques; vol. 37. No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements", IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels", IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

(56) References Cited

OTHER PUBLICATIONS

Henrie, et al., "Cancellation of Passive Intermodulation Distortion in Microwave Networks", Proceedings of the 38$^{th}$ European Microwave Conference, Oct. 2008, Amsterdam, The Netherlands, pp. 1153-1156.

Hong, et al., "Weighted Polynomial Digital Predistortion for Low Memory Effect Doherty Power Amplifier", IEEE Transactions on Microwave Theory and Techniques; vol. 55; No. 5, May 2007, pp. 925-931.

Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.

Lajoinie, et al. "Efficient Simulation of NPR for the Optimum Design of Satellite Transponders SSPAs", EEE MTT-S International; vol. 2; Jun. 1998; pp. 741-744.

Li et al. "High-Throughput Signal Component Separator for Asymmetric Multi-Level Outphasing Power Amplifiers", IEEE Journal of Solid-State Circuits; vol. 48; No. 2; Feb. 2013; pp. 369-380.

Liang, et al. "A Quadratic-Interpolated LUT-Based Digital Predistortion Techniques for Cellular Power Amplifiers", IEEE Transactions on Circuits and Systems; II: Express Briefs, vol. 61, No. 3, Mar. 2014; pp. 133-137.

Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.

Morgan, et al. "A Generalized Memory Polynomial Model for Digital Predistortion of RF Power Amplifiers", IEEE Transactions of Signal Processing; vol. 54; No. 10, Oct. 2006; pp. 3852-3860.

Naraharisetti, et al. "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.

Naraharisetti, et a., "2D Cubic Spline Implementation for Concurrent Dual-Band System", IEEE, 2013, pp. 1-4.

Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.

Panigada, et al. "A 130 mW 100 MS/s Pipelined ADC with 69 SNDR Enabled by Digital Harmonic Distortion Correction", IEEE Journal of Solid-State Circuits; vol. 44; No. 12; Dec. 2009, pp. 3314-3328.

Peng, et al. "Digital Predistortion for Power Amplifier Based on Sparse Bayesian Learning", IEEE Transactions on Circuits and Systems, II: Express Briefs; 2015, pp. 1-5.

Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.

Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.

Safari, et al. "Spline-Based Model for Digital Predistortion of Wide-Band Signals for High Power Amplifier Linearization", IEEE; 2007, pp. 1441-1444.

Sevic, et al. "A Novel Envelope-Termination Load-Pull Method of ACPR Optimization of RF/Microwave Power Amplifiers", IEEE MTT-S International; vol. 2, Jun. 1998; pp. 723-726.

Tai, "Efficient Watt-Level Power Amplifiers in Deeply Scaled CMOS", Ph.D. Dissertation; Carnegie Mellon University; May 2011; 129 pages.

Tehrani, et al. "Modeling of Long Term Memory Effects in RF Power Amplifiers with Dynamic Parameters", IEEE; 2012, pp. 1-3.

Yu, et al. "Band-Limited Volterra Series-Based Digital Predistortion for Wideband RF Power Amplifiers", IEEE Transactions of Microwave Theory and Techniques; vol. 60; No. 12; Dec. 2012, pp. 4198-4208.

Yu, et al. "Digital Predistortion Using Adaptive Basis Functions", IEEE Transations on Circuits and Systems—I. Regular Papers; vol. 60, No. 12; Dec. 2013, pp. 3317-3327.

Yu, et al. "A Generalized Model Based on Canonical Piecewise Linear Functions for Digital Predistortion", Proceedings of the Asia-Pacific Microwave Conference; 2016, pp. 1-4.

Zhang et al. "Linearity Performance of Outphasing Power Amplifier Systems", Design of Linear Outphasing Power Amplifiers; Google e-book; 2003; Retrieved on Jun. 13, 2014; Retrieved from internet <URL: http:www.artechhouse.com/uploads/public/documents/chapters/Zhang-Larson CH2.pdf; pp. 35-85.

Zhu et al. "Digital Predistortion for Envelope-Tracking Power Amplifiers Using Decomposed Piecewise Volterra Series", IEEE Transactions on Microwave Theory and Techniques; vol. 56; No. 10; Oct. 2008; pp. 2237-2247.

Guan et al. "Green communications: Digital predistortion for wideband RF power amplifiers." IEEE Microwave Magazine 15, No. 7 (2014): 84-99.

Zhu et al. "Dynamic deviation reduction-based Volterra behavioral modeling of RF power amplifiers." IEEE Transactions on microwave theory and techniques 54, No. 12 (2006): 4323-4332.

Zhu et al. "Open-loop digital predistorter for RF power amplifiers using dynamic deviation reduction-based Volterra series." IEEE Transactions on Microwave Theory and Techniques 56, No. 7 (2008): 1524-1534.

Cao et al. "Digital predistortion for high efficiency power amplifier architectures using a dual input modeling approach." IEEE Transactions on Microwave Theory and Techniques 60, No. 2 (2012): 1-10.

Naraharisetti. "Linearization of Concurrent Dual-Band Power Amplifier Using Digital Predistortion." PhD diss., The Ohio State University, 2014.

Tehrani et al. "Behavioral modeling of radio frequency transmitters". Chalmers University of Technology, 2009.

Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.

* cited by examiner

LINEARIZATION SYSTEM

CROSS-REFERENCE TO RELATED APPLICATIONS

This application claims the benefit of U.S. Provisional Application No. 62/517,380, file on Jun. 9, 2017, which is incorporated herein by reference.

BACKGROUND

This invention relates to digital compensation of a non-linear circuit, for instance linearization of a transmitter chain which may include a non-linear power amplifier, and more particularly relates to techniques for configuring or adapting a configuration used for such compensation.

A concept of applying a digital compensation to restore the quality of an original signal passed through a circuit may be well-known. A power amplifier in a radio of a wireless base station or handset may be compensated digitally in the baseband to minimize the spectral leakage into adjacent channels. An audio amplifier in a speaker may be compensated digitally to achieve high fidelity. In many such examples, variants of Volterra series have been adopted to account for dynamical nature of nonlinearity. Wiener, Wiener-Hammerstein, General Memoryless Polynomial are popular structures for digital pre-distorters, which are used to modify an input signal prior to passing through a non-linear circuit. In general, these structures have an exponential complexity if the polynomial order exceeds 3 to 5, as well as robustness issues due to sensitivity of compensator parameters to variations of a particular device (Device Under Test, DUT), including process, temperature, supply voltage, and other operating conditions.

Figure 1:
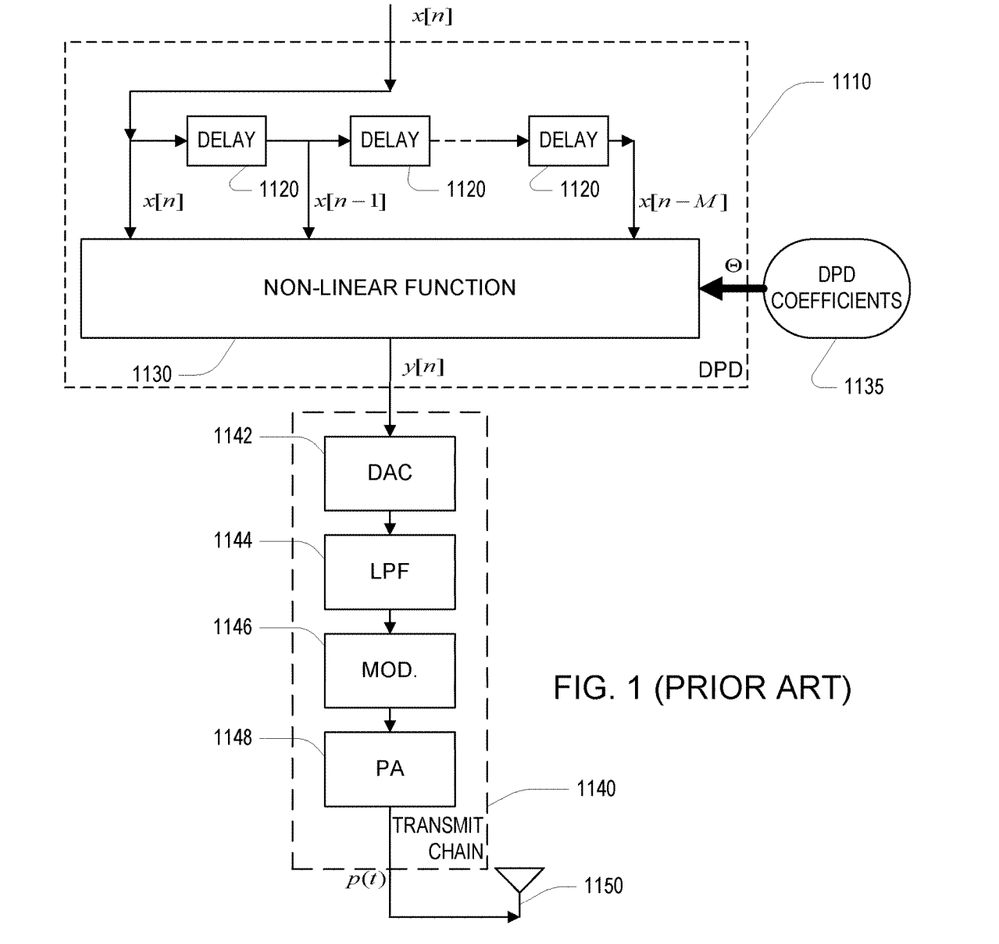
FIG. 1 is a block diagram of a conventional digital pre-distortion approach.

Referring to FIG. 1, in an example of a linearization of a radio power amplifier, a digital input signal x[n] at a baseband or intermediate frequency is passed through a Digital Pre-Distorter (DPD) 1110 to produce a "pre-distorted" signal y[n], which is passed through a transmit chain 1140 to produce a driving signal p(t) that drives an antenna 1150. The transmit chain may include a Digital-to-Analog Converter (DAC) 1142, an analog lowpass filter (LPF) 1144, and a modulator (e.g., multiplication by a local oscillator) of the output of the LPF 144. The output of the modulator is passed to a power amplifier (PA) 1148. The PA 1148, as well as other elements in the transmit chain, may introduce non-linearities, which may be manifested in the driving signal p(t) as harmonic and/or intermodulation distortion of the input signal x[n]. To overcome these nonlinearities, the DPD 110 also introduces non-linearities that are intended to "pre-invert" (i.e. pre-distort) the non-linear effects of the transmit chain. In some examples, the DPD performs the transformation of the desired signal x[n] to the input y[n] of the transmit chain by using delay elements 1120 to form a set of delayed versions of the desired signal, and then using a non-linear polynomial function 1130 of those delayed inputs. In some examples, the non-linear function is a Volterra series:

$$y[n] = h_0 + \sum_p \sum_{\tau_1, \ldots, \tau_p} h_p(\tau_1, \ldots, \tau_p) \Pi_{j=1 \ldots p} x[n-\tau_j]$$

In some examples, the non-linear function is reduced set of Volterra terms, for example a delay polynomial:

$$y[n] = h_0 + \sum_p \sum_\tau h_p(\tau) x[n-\tau] |x[n-\tau]|^{(p-1)}$$

In order to invert the non-linear effects of the transmit chain, in general, a relatively large number of terms of such a series representation are needed, and the coefficients of those terms (e.g., the $h_p$ terms) must be accurately set. In general, the coefficients in such approaches are continually updated to maintain good linearization. Various approaches to such continual updating are used, for example, based on incremental updates using y[n] and observation of p(t) (e.g., after demodulation).

A number of techniques are known for determining values of the coefficients for such linearization system. However, many such techniques suffer from aspects such as poor convergence in iterative computation of the values, and in lack of robustness of the coefficient values to changes in operating conditions.

SUMMARY

In a general aspect, a linearization system computes a robust set of quantities characterizing a nonlinearity of a transmit chain including a power amplifier by combining a current set of quantities characterizing the nonlinearity of the transmit chain with a weighted combination of prior sets of quantities characterizing the nonlinearity of the transmit chain.

In another aspect, in general, a method for digital compensation of a signal chain comprising at least one analog electronic amplification element comprises receiving an input signal to the signal chain. The input signal comprising a plurality of batches of the input signal, each batch corresponding to a different time interval of the input signal. An output signal of the signal chain is also received. The output signal comprising a plurality of batches of the output signal, each batch of the output signal corresponding to a different batch of the input signal. The method includes computing coefficient values for a digital compensator from the plurality of batches of the input signal and the corresponding batches of the output signal. This computing of the coefficient values includes evaluating for each batch of the input signal output of application of a plurality of basis functions to said batch of the input signal, computing a first average over the plurality of batches of the input signal of a first function of the output of the application of the plurality of basis functions to corresponding batches of the input signal, computing a second average over the plurality of batch the input signal of a second function the output of the application of the plurality of basis functions to corresponding batches of the input signal and corresponding batches of the output signal, and computing the coefficient values from the first average and the second average. A desired input signal is processed with the digital compensator configured according to the coefficient values to produce an input signal for the signal chain.

Aspects may include one or more of the following features.

The first average comprises a decaying average, and the second average comprises a decaying average. For instance, each decaying average corresponds to an exponentially decaying average according to weighting proportional to $\lambda^{-i}$ where i is an increasing index of the batches over time and $0 < \lambda < 1$ is a real quantity characterizing the rate of exponential decay.

Application of the plurality of basis functions to an $i^{th}$ batch of the input signal is equivalent to a matrix $A_i$ having a number of columns equal to a number of the basis functions and a number of rows equal to a number of samples in the batch of the input signal, and the first function is equivalent to $A_i^H A_i + \rho I$, where $A_i^H$ is a transpose of complex conjugate of $A_i$ and I is an identity matrix, where $\rho$ is a real number that is zero or is positive.

Computing the first average includes updating the first average using the $n^{th}$ batch using an previous value of the first average, $G_L^{n-1}$ computed without the $n^{th}$ batch according to an update equation $G_L^n = \lambda G_L^{n-1} + (1-\lambda)(A_n^H A_p + \rho I)$.

An $i^{th}$ batch of the output signal is equivalent to a vector $b_i$, having a number of rows equal to a number of samples in the batch of the output signal, and the second function is equivalent to $A_i^H b_i$ Computing the second average includes updating the second average using the $n^{th}$ batch using an previous value of the first average, $G_R^{n-1}$ computed without the $n^{th}$ batch according to an update equation $G_R^n = \lambda G_R^{n-1} + (1-\lambda) A_n^H b_n$.

Computing the coefficient values from the first average, $G_L^n$, and the second average, $G_R^n$, is according to an equation $\alpha = (G_L^n)^{-1} G_R^n$.

Computing the coefficient values from the first and the second averages includes determining said values according to the equation $\alpha = (G_L^n)^{-1} G_R^n$ subject to bounds on the magnitudes of the coefficient values, $\alpha_L \leq \alpha \leq \alpha_U$.

Each batch of the input signal corresponds to a time interval of the input signal having a same duration.

The plurality of basis functions comprise products of delayed values or conjugates or magnitudes of delayed values.

Processing a desired input signal with the digital compensator configured according to the coefficient values includes weighting the outputs of application of the basis functions to the desired input signal by the computed coefficient values.

Other features and advantages of the invention are apparent from the following description, and from the claims.

DESCRIPTION

As introduced above, a digital compensator may be configurable with values of a set of coefficients that determine how the compensator operates, and in particular, that determine the non-linear function implemented by the compensator as part of the linearization approach. Example of such compensators are described above and in U.S. Pat. No. 9,590,668, "Digital Compensator," issued on Mar. 7, 2017, which is incorporated herein by reference.

Figure 2:
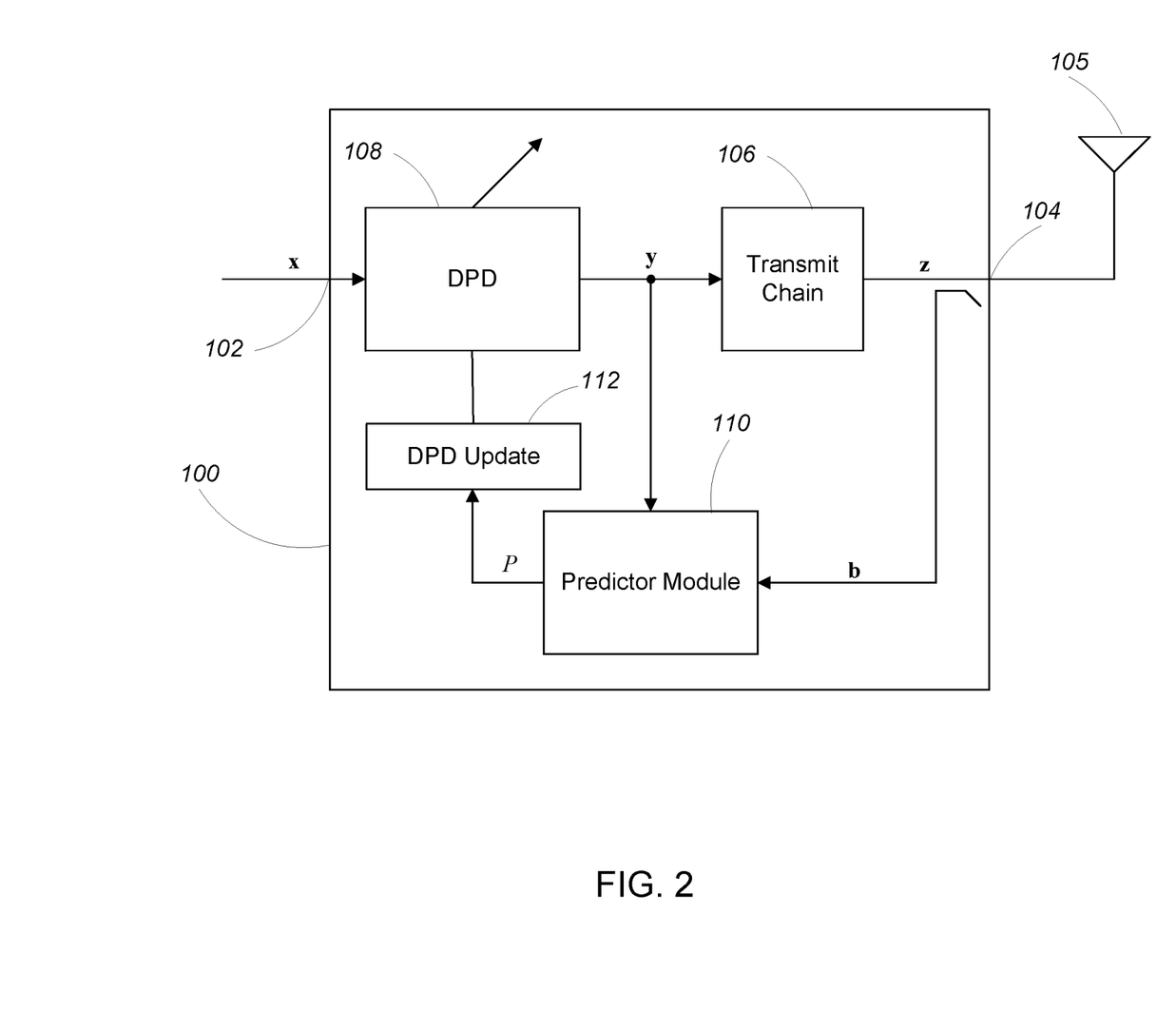
FIG. 2 is a block diagram of a first linearization system.

Referring to FIG. 2, in a first embodiment, a linearization system 100 includes an input 102 for receiving an input signal, x and an output 104 for providing an output signal, z to an antenna 105. The system 100 includes a transmit chain 106, a digital predistorter (DPD) 108, a DPD update module 112, and a predictor module 110. In general, the transmit chain 106 has a nonlinear input/output power characteristic because it includes a power amplifier and/or other nonlinear components.

When an intermediate input signal, y is provided to the transmit chain 106, the transmit chain 106 generates an output signal, z as an amplified version of the intermediate input signal, y. In general, the output signal, z includes nonlinear distortion due to the nonlinear input/output power characteristic of the transmit chain 106.

Without compensation, the output signal, z would not be an accurate amplified reproduction of the input signal, x. The system 100 includes the DPD 108 to compensate for the nonlinear distortion introduced by the transmit chain 106. In particular, the DPD 108 receives the input signal, x and "predistorts" the signal to generate the intermediate input signal, y. Ideally, the intermediate input signal, y includes an "inverse nonlinear distortion" (i.e., an inverse of the nonlinear distortion introduced by the transmit chain 106), such that the nonlinear distortion introduced by the transmit chain 106 is substantially cancelled by the inverse nonlinear distortion. The output signal, z is therefore substantially free of nonlinear distortion.

In some examples, the DPD 108 operates according to an inverse model of the nonlinear distortion of the transmit chain 106 such that providing the input signal, x to the DPD 108 causes the DPD 108 to generate the intermediate input signal, y as follows:

$$y = 2x + \sum_{i=1}^{n} a_i f_i(x)$$

where $f_i(\bullet)$ is the $i^{th}$ basis function of n basis functions and $\alpha_i$ is the $i^{th}$ parameter (e.g., the $i^{th}$ weight) corresponding to the $i^{th}$ basis function. Each basis function is a linear function (e.g., $x(t-1)$) or a non-linear function (e.g., $|x(t)|^2$) of the input, x, which may include memory (e.g., $x(t)^*x(t-1)$).

In general, the nonlinear input/output characteristic of the transmit chain 106 may change over time. The parameters, a used by the DPD 108 to generate the intermediate input signal, y are there therefore iteratively updated to reflect the changes in the nonlinear input/output characteristic of the transmit chain 106.

To update the parameters, a used by the DPD 108, the predictor module 110 processes the intermediate input signal, y and a sensed version of the output signal, b∝z to generate an updated set of parameters, a'. In one example, the predictor module 110 determines an updated set of parameters a' that, in combination with the basis functions and the intermediate input signal, y generate a predicted signal that is as close as possible to the sensed signal, b (e.g., in a least mean squared error sense):

$$P: y \to b$$

which can be restated as $$P(y) = \sum_{i=1}^{n} \alpha_i f_i(y).$$

In some examples, the predictor parameters a are determined using techniques described in the "Parameter Update" section below.

The predictor, P is provided to a DPD update module 112 which processes the predictor, P to update the DPD 108. In some examples, for the predictor, P described above, the DPD update module 112 configures the DPD 108 to perform according to an approximate inverse of the predictor, P as follows:

$$DPD(x) = P^{-1}(x) \approx 2x - \sum_{i=1}^{n} \alpha_i f_i(x)$$

or by explicitly setting the DPD parameters as: $\alpha_i' = -\alpha_i$.

In another example, the predictor module 110 determines an updated set of parameters $\hat{\alpha}$ that, in combination with the basis functions and the sensed signal, b generate a predicted signal, $\hat{y}$ that is as close as possible to the intermediate input signal, y (e.g., in a least mean squared error sense):

$$P:b \to \hat{y}$$

which can be restated as $$P(b) = \sum_{i=1}^{n} \alpha_i f_i(b).$$

That is, P is an estimate of a (post) inverse of the nonlinearity of the transmit chain 106. In some examples, the updated set of parameters α is determined using techniques described in the "Parameter Update" section below.

The predictor, P is provided to a DPD update module 112 which processes the predictor, P to update the DPD 108. In some examples, for the predictor, P described immediately above, the DPD update module 112 configures the DPD 108 to perform according to the predictor, P as follows:

$$DPD(x) = P(x) = \sum_{i=1}^{n} \alpha_i f_i(x)$$

or essentially $\alpha'_i = \alpha_i$.

Figure 3:
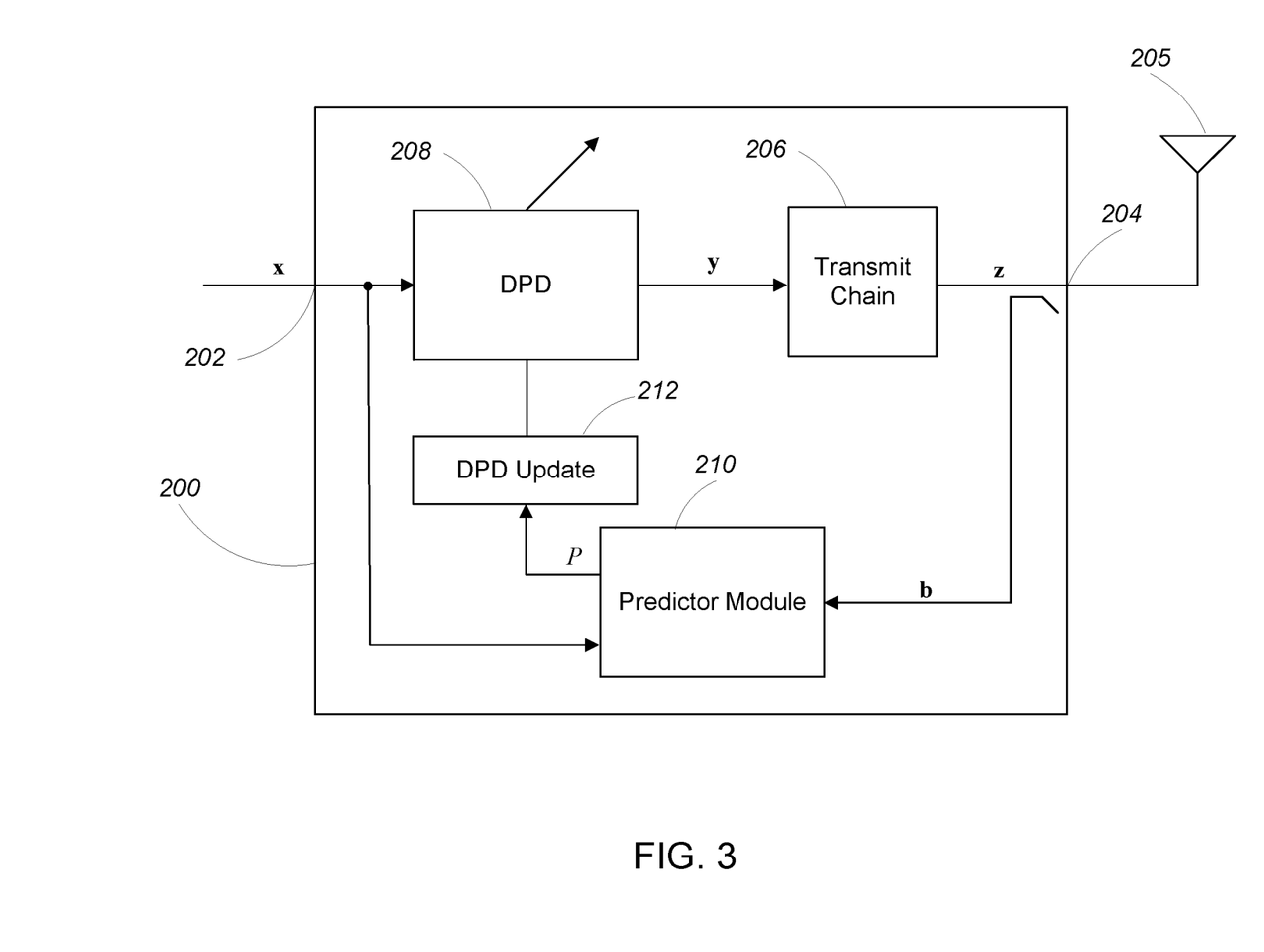
FIG. 3 is a block diagram of a second linearization system.

Referring to FIG. 3, in another embodiment, a linearization system 200 includes an input 202 for receiving an input signal, x and an output 204 for providing an output signal, z to an antenna 205. The system 200 includes a transmit chain 206, a digital predistorter (DPD) 208, a DPD update module 212, and a predictor module 210. In general, the transmit chain 206 has a nonlinear input/output power characteristic because it includes a power amplifier and other nonlinear components.

An intermediate input signal, y is provided to the transmit chain 206, which outputs an output signal, z (i.e., an amplified version of the amplifier input signal), which is distorted due to the nonlinear input/output power characteristic of the transmit chain 206.

As was the case above, without compensation, the output signal, z would not be an accurate amplified reproduction of the input signal, x. The system 200 includes the DPD 208 to compensate for the nonlinear distortion introduced by the transmit chain 206. In particular, the DPD 208 receives the input signal, x and "predistorts" the signal to generate the intermediate input signal, y. Ideally, the intermediate input signal, y includes an "inverse nonlinear distortion" (i.e., an inverse of the nonlinear distortion introduced by the transmit chain 206), such that the nonlinear distortion introduced by the transmit chain 206 is substantially cancelled by the inverse nonlinear distortion. The output signal, z is therefore substantially free of nonlinear distortion.

In general, the nonlinear input/output characteristic of the transmit chain 206 may change over time. The parameters, α used by the DPD 208 to generate the intermediate input signal, y are there therefore iteratively updated reflect the changes in the nonlinear input/output characteristic of the transmit chain 206.

In the system of FIG. 2, to update the parameters, α used by the DPD 208, the predictor module 210 processes the input signal, x and a sensed version of the output signal, b∝z to generate an updated set of parameters, a that, in combination with the basis functions, represent a difference between the model of the nonlinear input/output characteristic of the transmit chain 206 currently being used by the DPD 208 and the current nonlinear input/output characteristic of the transmit chain 206. In one example, the predictor module 210 determines parameters α that, in combination with the basis functions and the input signal, x generate a predicted signal, $\hat{b}$ that is as close as possible to the sensed signal, b (e.g., in a least mean squared error sense):

$$P:x \to \hat{b}$$

which can be restated as $$P(x) = \sum_{i=1}^{n} \alpha_i f_i(x).$$

The parameters α in combination with the basis functions represent the difference between the model of the nonlinear input/output characteristic of the transmit chain 206 currently being used by the DPD 208 and the current nonlinear input/output characteristic of the transmit chain 206 because the effects both the DPD 208 and the transmit chain 206 on the input signal, x are represented in the sensed signal, b.

In some examples, the set of parameters a is determined using techniques described in the "Parameter Determination" section below.

The predictor P is provided to a DPD update module 212 which processes the predictor, P to update the DPD 208. In some examples, for the predictor, P described immediately above, the DPD update module 212 configures the DPD 208 to combine an approximate inverse of the predictor with the existing DPD 208 as follows:

$$\alpha'_i \leftarrow \alpha_i + \alpha_i.$$

This essentially approximates a cascade of the approximate inverse of the predictor, $P^{-1}$ with the previous DPD configuration to yield the new DPD configuration.

The above process is performed iteratively and therefore the coefficients are expected to be small in a steady state of the system.

In another example, the predictor module 210 determines a set of parameters a that, in combination with the basis functions and the sensed signal, b generate a predicted signal, $\hat{x}$ that is as close as possible to the input signal, x (e.g., in a least mean squared error sense):

$$P:b \to \hat{x}$$

which can be restated as $$P(b) = \sum_{i=1}^{n} \alpha_i f_i(b).$$

In some examples, the updated set of parameters α is determined using techniques described in the "Parameter Determination" section below.

The predictor, P is provided to a DPD update module 212 which processes the predictor, P to update the DPD 208. In some examples, for the predictor, P described immediately above, the DPD update module 212 configures the DPD 208 to combine an approximation of the predictor with the existing DPD 208 as follows:

$$\alpha'_i \leftarrow \alpha_i + \alpha_i.$$

Parameter Determination

In some examples, the predictor P: $x \to \hat{b}$ parameters, $\alpha$ described above are determined in batches using a least squares algorithm as follows:

$$\alpha = \operatorname{argmin} |A\alpha - b|_2^2 = \operatorname{argmin}(\alpha^H A^H A \alpha - 2 A^H b \alpha + b^H b)$$

where b is a vector of sensed signal samples and A is a matrix where each column includes the samples of the basis function, $f_i(x)$. The solution for $\alpha$ is therefore:

$$\alpha = (A^H A)^{-1} A^H b.$$

That is, in this formulation, the samples of the sensed signal and the basis function are used once for the batch, and not used in subsequent determination of future coefficient values $\alpha$.

A number of improvements make use of generally smaller batches of samples of the signals, but each sample is used repeatedly for a number of determinations of the coefficient values. The approach that implements this repeated use of the smaller batches can improve robustness such that any one of the smaller batches, even if having unusual or non-representative data for some reason (e.g., a "glitch"), does not have as significant and impact as compared to a computation on a larger batch.

Anther improvement makes use of a "regularization" of the criterion for determining the coefficient values to bias the result away from coefficient values with large magnitudes. This feature also provides robustness by being less sensitive to batches of data that might result in unusually large and likely not robust coefficient values.

In some examples, the technical improvements include robustness, reliability, and/or improved convergence of coefficients, $\alpha$. The improvements involve modifying the least squares optimization problem to incorporate a history of previous batches of the input as follows:

$$\alpha = \operatorname*{argmin}_{\alpha} \begin{pmatrix} \alpha^H \left[ (1-\lambda) \sum_{i=1}^{n} \lambda^{n-i} A_i^H A_i \right] \alpha - \\ 2(1-\lambda) \sum_{i=1}^{n} \lambda^{n-i} A_i^H b_i \alpha + \\ \sum_{i=1}^{n} b_i^H b_i + \rho \alpha^H \alpha \end{pmatrix}$$

where $A_i$ and $b_i$ correspond to inputs and outputs for batch i=1, . . . and $\alpha$ depends on the samples from all batches 1 to n. The above equation is subject to $\alpha_L \leq \alpha \leq \alpha_U$, $0 < \lambda < 1$, and $\rho > 0$.

In the above optimization problem, the large batch term (a Gramian)

$$A^H A$$

is replaced with $$(1-\lambda) \sum_{i=1}^{n} \lambda^{n-i} A_i^H A_i,$$

which is a "memory Gramian." Use of the memory Gramian improves the convergence properties of the optimization process, safeguards against glitches in system behavior, and improves overall performance of the system. Note that each smaller batch of samples of the basis functions $A_i$ contributes at a decaying weight the more distant in the past the smaller batch. Although it should be clear that various forms for averaging of the smaller batches (i.e., averaging over i) may be used (e.g., sliding rectangular window, etc.), a decaying exponential window proportional to $\lambda^{n-i}$ allows iterative updating of the averages as described below.

A similar averaging is used replacing the large batch term with $A^H b$ $$(1-\lambda) \sum_{i=1}^{n} \lambda^{n-i} A_i^H b_i,$$

which is also provides the decaying average of the small batch contributions. Similarly, $$b^H b$$

is replaced with the equivalent expression $$\sum_{i=1}^{n} b_i^H b_i.$$

Finally, a new term $$\rho \alpha^H \alpha$$

is added such that with $\rho > 0$, large magnitude elements of $\alpha$ are biased against in the optimization.

As introduced above, an advantage of using an exponential decaying average of the contributions of the smaller batches is that an iterative updating of the parameters may be used. In particular, at the $n^{th}$ update of the predictor parameters, $\alpha$ is determined based on retaining quantities $G_L^{n-1}$ and $G_R^{n-1}$ from the previous iteration (i.e., from after updating on the previous small batch), computing $G_L^n$ and $G_R^n$ from the retained quantities and the new small batch data, and computing $\alpha$ as $$\alpha = (G_L^n)^{-1} G_R^n.$$

Note that a best solution that satisfies $\alpha_L \leq \alpha \leq \alpha_U$ (element-wise) may be used rather than exact solution using the matrix inverse.

This iteration may be initialized at the first small batch (n=1) as $$G_L^1 = A_1^H A_1 + \rho I,$$

$$G_R^1 = A_1^H b_1,$$

and updated at each iteration as $$G_L^n = \lambda G_L^{n-1} + (1-\lambda)(A_n^H A_n + \rho I),$$

$$G_R^n = \lambda G_R^{n-1} + (1\lambda) A_n^H b_n.$$

thereby converging to the optimal solution for the coefficient values $\alpha$.

Optionally, the resulting coefficient values are further modified to improve the stability to produce the actual predictor parameters, $\alpha_A$ according to:

$$\alpha_A + \alpha_A + \eta(\alpha - \alpha_A)$$

The values of the parameters, $\alpha_A$ are then used as the predictor parameters as described in the approaches above.

In some implementations, a computer accessible non-transitory storage medium includes a database representative of a system including some or all of the components of the linearization system. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, Alternatively, the database may itself be the netlist (with or without the synthesis library) or the data set.

It is to be understood that the foregoing description is intended to illustrate and not to limit the scope of the invention, which is defined by the scope of the appended claims. Other embodiments are within the scope of the following claims.

What is claimed is:

1. A method for digital compensation of a signal chain comprising at least one analog electronic amplification element, the method comprising:
   receiving an input signal to the signal chain, the input signal comprising a plurality of batches of the input signal, each batch of the input signal corresponding to a different time interval of the input signal;
   receiving an output signal of the signal chain, the output signal comprising a plurality of batches of the output signal, each batch of the output signal corresponding to a different batch of the input signal;
   computing coefficient values for a digital compensator from the plurality of batches of the input signal and the corresponding batches of the output signal, including
      evaluating, for each batch of the input signal, output of application of a plurality of basis functions to said batch of the input signal,
      computing a first average over the plurality of batches of the input signal of a first function of the output of the application of the plurality of basis functions to corresponding batches of the input signal,
      computing a second average over the plurality of batches of the input signal of a second function of the output of the application of the plurality of basis functions to corresponding batches of the input signal and corresponding batches of the output signal, and
      computing the coefficient values from the first average and the second average; and
   processing a desired input signal with the digital compensator configured according to the coefficient values to produce the input signal for the signal chain.

2. The method of claim 1 wherein the first average comprises a decaying average, and the second average comprises a decaying average.

3. The method of claim 2 wherein each decaying average corresponds to an exponentially decaying average according to weighting proportional to $\lambda^{-i}$ where i is an increasing index of the batches over time and $0<\lambda<1$ is a real quantity characterizing the rate of exponential decay.

4. The method of claim 1 wherein application of the plurality of basis functions to an $i^{th}$ batch of the input signal is equivalent to a matrix $A_i$ having a number of columns equal to a number of the basis functions and a number of rows equal to a number of samples in the batch of the input signal, and the first function is equivalent to $A_i^H A_i + \rho I$, where $A_i^H$ is a transpose of complex conjugate of $A_i$ and I is an identity matrix, where $\rho$ is a real number that is zero or is positive.

5. The method of claim 4 wherein the plurality of batches of the input signal comprises n batches of the input signal and the first average comprises a matrix, $G_L^n$, and wherein computing the first average includes updating a previous value of the first average, $G_L^{n-1}$, computed without the $n^{th}$ batch of the input signal, using the $n^{th}$ batch of the input signal $G_L^{n-1}$ $n^{th}$ according to an update equation $G_L^n = \lambda G_L^{n-1} + (1-\lambda)(A_n^H A_n + \rho I)$.

6. The method of claim 4 wherein an $i^{th}$ batch of the output signal is equivalent to a vector $b_i$, having a number of rows equal to a number of samples in the batch of the output signal, and the second function is equivalent to $A_i^H b_i$.

7. The method of claim 6 wherein the plurality of batches of the output signal comprises n batches of the output signal and the second average comprises a vector, $G_R^n$, and wherein computing the second average includes updating the second average using the $n^{th}$ batch using a previous value of the first average, $G_R^{n-1}$, computed without the $n^{th}$ batch according to an update equation $G_R^n = \lambda G_R^{n-1} + (1-\lambda)A_n^H b_n$.

8. The method of claim 1 wherein the first average comprises a matrix, $G_L^n$, the second average comprises a vector, $G_R^n$, and computing the coefficient values from the first average and the second average is according to an equation.

9. The method of claim 8 wherein computing the coefficient values from the first and the second averages includes determining said values $\alpha = (G_L^n)^- G_R^n$ subject to bounds on the magnitudes of the coefficient values $\alpha_L \leq \alpha \leq \alpha_U$.

10. The method of claim 1 wherein each batch of the input signal corresponds to a time interval of the input signal having a same duration.

11. The method of claim 1 wherein the plurality of basis functions comprise products of delayed values or conjugates or magnitudes of delayed values.

12. The method of claim 1 wherein processing the desired input signal with the digital compensator configured according to the coefficient values includes weighting the outputs of application of the basis functions to the desired input signal by the computed coefficient values.

13. A non-transitory machine-readable medium comprising instructions stored thereon, execution of the instructions causing a data processing system to digitally compensate a signal chain comprising at least one analog electronic amplification element by performing operations comprising:
   receiving an input signal to the signal chain, the input signal comprising a plurality of batches of the input signal, each batch of the input signal corresponding to a different time interval of the input signal;
   receiving an output signal of the signal chain, the output signal comprising a plurality of batches of the output signal, each batch of the output signal corresponding to a different batches of the input signal;
   computing coefficient values for a digital compensator from the plurality of batches of the input signal and the corresponding batches of the output signal, including evaluating, for each batch of the input signal, output of application of a plurality of basis functions to said batches of the input signal, computing a first average over the plurality of batches of the input signal of a first function of the output of the application of the plurality of basis functions to corresponding batches of the input signal, computing a second average over the plurality of batch the input signal of a second function of the output of the application of the plurality of basis functions to corresponding batches of the input signal and corresponding batches of the output signal, and computing the coefficient values from the first average and the second average; and processing a desired input signal with the digital compensator configured according to the coefficient values to produce the input signal for the signal chain.

14. A digital compensator for compensating a signal chain comprising at least one analog electronic amplification element, the compensator comprising:

a storage for coefficient values for configuration of the digital compensator;

an input for receiving an input signal to the signal chain, the input signal comprising a plurality of batches of the input signal, each batch corresponding to a different time interval of the input signal;

an output for receiving an output signal of the signal chain, the output signal comprising a plurality of batches of the output signal, each batch of the output signal corresponding to a different batches of the input signal; and a computation element configured to compute coefficient values for a digital compensator from the plurality of batches of the input signal and the corresponding batches of the output signal by evaluating for each batch of the input signal output of application of a plurality of basis functions to said batch of the input signal, computing a first average over the plurality of batches of the input signal of a first function of the output of the application of the plurality of basis functions to corresponding batches of the input signal, computing a second average over the plurality of batch the input signal of a second function of the output of the application of the plurality of basis functions to corresponding batches of the input signal and corresponding batches of the output signal, and computing the coefficient values from the first average and the second average; and wherein the digital compensator is configured by storing the computed coefficient values in the storage for the coefficient values to process a desired input signal to produce the input signal for the signal chain.

15. A non-transitory machine-readable medium, comprising a design structure encoded thereon, said design structure comprising elements, when processed in a computer-aided design system, generate a machine-executable representation of a digital compensator for compensating a signal chain comprising at least one analog electronic amplification element, wherein said digital compensator in operation is configured to perform operations comprising:

receiving an input signal to the signal chain, the input signal comprising a plurality of batches of the input signal, each batch of the input signal corresponding to a different time interval of the input signal;

receiving an output signal of the signal chain, the output signal comprising a plurality of batches of the output signal, each batch of the output signal corresponding to a different batch of the input signal;

computing coefficient values for a digital compensator from the plurality of batches of the input signal and the corresponding batches of the output signal, including evaluating for each batch of the input signal output of application of a plurality of basis functions to said batches of the input signal, computing a first average over the plurality of batches of the input signal of a first function of the output of the application of the plurality of basis functions to corresponding batches of the input signal, computing a second average over the plurality of batch the input signal of a second function of the output of the application of the plurality of basis functions to corresponding batches of the input signal and corresponding batches of the output signal, and computing the coefficient values from the first average and the second average; and processing a desired input signal with the digital compensator configured according to the coefficient values to produce the input signal for the signal chain.

16. The medium of claim 15 wherein the first average comprises a decaying average, and the second average comprises a decaying average.

17. The medium of claim 16 wherein each decaying average corresponds to an exponentially decaying average according to weighting proportional to $\lambda^{-i}$ where i is an increasing index of the batches over time and $0<\lambda<1$ is a real quantity characterizing the rate of exponential decay.

18. The medium of claim 15 wherein application of the plurality of basis functions to an $i^{th}$ batch of the input signal is equivalent to a matrix $A_i$ having a number of columns equal to a number of the basis functions and a number of rows equal to a number of samples in the batch of the input signal, and the first function is equivalent to $A_i^H A_i + \rho I$, where $A_i^H$ is a transpose of complex conjugate of $A_i$ and I is an identity matrix, where $\rho$ is a real number that is zero or is positive.

19. The medium of claim 15 wherein the first average comprises a matrix, $G_L^n$, the second average comprises a vector, $G_R^n$, and computing the coefficient values from the first average and the second average is according to an equation $\alpha = (G_L^n)^{-1} G_R^n$.

20. The medium of claim 15 wherein:

application of the plurality of basis functions to an $i^{th}$ batch of the input signal is equivalent to a matrix $A_i$ having a number of columns equal to a number of the basis functions and a number of rows equal to a number of samples in the batch of the input signal, and the first function is equivalent to $A_i^H A_i + \rho I$, where $A_i^H$ is a transpose of complex conjugate of $A_i$ and I is an identity matrix, where $\rho$ is a real number that is zero or is positive;

the plurality of batches of the input signal comprises n batches of the input signal and the first average comprises a matrix, $G_L^n$, and wherein computing the first average includes updating a previous value of the first average, $G_L^{n-1}$, computed without the $n^{th}$ batch of the input signal, using the $n^{th}$ batch of the input signal according to an update equation $G_L^n = \lambda G_L^{n-1} + (1-\lambda)(A_n^H A_n + \rho I)$;

an $i^{th}$ batch of the output signal is equivalent to a vector $b_i$, having a number of rows equal to a number of samples in the batch of the output signal, and the second function is equivalent to $A_i^H b_i$; and the plurality of batches of the output signal comprises n batches of the output signal and the second average comprises a vector, $G_R^n$, and wherein computing the second average includes updating the second average using the $n^{th}$ batch using an previous value of the first average, $G_R^{n-1}$ computed without the $n^{th}$ batch according to an update equation $G_R^n = \lambda G_R^{n-1} + (1-\lambda) A_n^H b_n$.

* * * * *